United States Patent [19]

Morrison, Jr.

[11] Patent Number: 4,867,935

[45] Date of Patent: Sep. 19, 1989

[54] METHOD FOR PREPARING CERAMIC TAPE COMPOSITIONS

[75] Inventor: William H. Morrison, Jr., Wilmington, Del.

[73] Assignee: E. I. Du Pont de Nemours and Company, Wilmington, Del.

[21] Appl. No.: 161,023

[22] Filed: Feb. 26, 1988

[51] Int. Cl.[4] .............................................. C04B 33/28
[52] U.S. Cl. ........................................ 264/61; 156/89; 264/63; 264/66; 264/DIG. 6; 29/830
[58] Field of Search ............... 264/61, 63, 66, DIG. 6; 156/89; 29/830

[56] References Cited

U.S. PATENT DOCUMENTS 4,141,055  2/1979  Berry et al. .......................... 361/410
4,661,301  4/1987  Okada ............................ 264/DIG. 6

FOREIGN PATENT DOCUMENTS 57220331  6/1984  Japan.

OTHER PUBLICATIONS

Leap et al., "Low Permittivity Silica Hollow Glass Microspheres 0-3 Composites", Pennsylvania State University, Materials Research Laboratory, Publication Date Unknown.

Primary Examiner—James Derrington
Attorney, Agent, or Firm—Charles E. Krukiel

[57] ABSTRACT

A method for preparing a dielectric ceramic composition containing hollow microspheres which is castable on a substrate in the form of a tape or sheet for multilayer circuits in which crushing or breaking of the microspheres is avoided, and a multilayer sheet structure formed from said tape.

10 Claims, No Drawings

METHOD FOR PREPARING CERAMIC TAPE COMPOSITIONS

BACKGROUND OF THE INVENTION

The present invention relates to an improved method for preparing dielectric ceramic compositions, and, more particularly, to a method for preparing a ceramic composition containing hollow microspheres which is castable on a substrate in the form of a tape for multilayer circuits.

Multilayer electronic circuits are widely used to increase circuit functionality per unit of area. Such circuits are normally made by first casting substrates in the form of sheets or a tape of unfired (green) ceramic, which are punched with via holes, screen printed with circuit metallurgy, laminated into a monolithic three-dimensional structure, and sintered. The ceramic substrate and metallurgical circuit components both densify simultaneously in the same firing cycle.

In order to take full advantage of the very high switching speeds of present day circuitry, faster signal transport through interconnects is necessary. The signal time delay of an electromagnetic wave on the substrate surface is a function of the dielectric constant of the substrate, and, consequently, a low dielectric constant is highly desirable.

Virteous silica has the lowest dielectric constant, 3.8–4 at 1 MHz of known silica phase ceramics, but high temperatures required for densification will normally preclude use of conventional conductive materials such as gold, silver and copper.

Lower sintering temperatures can be used to make dense substrates from many glass powders, but dielectric constants are in the 4–8 range at 1 MHz. To take full advantage of maximum available switching speeds, a substrate dielectric constant of 3 or less at 1 MHz is desirable.

One way to achieve a low substrate dielectric constant is to disperse hollow ceramic microspheres throughout the substrate. Composites made from glass powder and hollow alumina microspheres have dieletric constants generally in the range of 4–5 at 1 MHz, and those made using hollow silica microspheres can be in the range of 3.3–4 at 1 MHz.

Published Japanese patent application No. SHO 57[1982]-220331, "Circuit Substrate With Low Dielectric Constant", for example, describes a circuit substrate obtained by sintering a ceramic powder feed matrix having inorganic hollow spherical particles dispersed therein. The hollow particles comprise alumina ($Al_2O_3$), but no processing techniques for preparing the matrix are described.

U.S. Pat. 4,141,055 describes a crossover structure for microelectric circuits which utilizes a dielectric material which includes spheres of an insulating material in order to separate the conductors. A UV curable epoxy including hollow glass spheres is deposited on the crosspoint areas followed by deposition of the crossover connector. In the preparation of the dielectric, the epoxy and the hollow spheres are mixed first by hand and then in a standard 3 roll mixer along with a silica filler.

Marcia J. Leap et al., Materials Research Laboratory, The Pennsylvania State University, published a paper entitled "Low Permittivity Silica Hollow Glass Microspheres 0–3 Composites" which describes the processing and dielectric properties of glass/air composites formed by sintering silica hollow glass microspheres. Specimens were prepared from a batch consisting of 10 vol. % lead glass powder and 90 vol. % $SiO_2$ hollow glass microspheres. The powders were dry mixed manually, and, after addition of a binder solution, the mixture was dried and then milled for 5 minutes. SEM micrographs revealed that a large percentage of spheres had broken during milling.

The methods of the prior art have not taken full advantage of using microspheres for improving dielectric ceramic compositions. The procedures which have been used can result in crushing and breaking the shells of the microspheres and consequent loss of hermeticity/increase in dielectric constant. Thus, for a given composition, the optimum dielectric constant may not be obtained, and, due to a loss of hermeticity, there may also be an increased chance of failure in the multilayer electronic circuits in which these ceramics play a critical role.

In order to consistently make high quality low dielectric ceramic substrates, suitable for use with conventional conductive materials, a procedure is needed which will yield a uniform, hermetic distribution of intact hollow microspheres throughout a dense glass matrix.

SUMMARY OF THE INVENTION

The present invention is a method for making a dielectric sheet composition having a low dielectric constant and a high hermeticity comprising the steps of:

(a) mixing a glass powder, optionally a particulate refractory, a volatile, non-aqueous organic solvent containing an organic polymeric binder, and an organic plasticizer to form a uniform dispersion;

(b) milling the dispersion to pulverize and homogeneously disperse the glass component;

(c) dispersing ceramic hollow microspheres at high speed into the milled mixture, minimizing disruption of the microspheres, to form a slip having a viscosity in the range of 500–1500 cps;

(d) deaerating the slip and casting a thin layer onto a flexible substrate forming a sheet within 1 hour of its preparation, and heating the cast layer at 20°–50° C. to remove volatile solvent therefrom;

(e) removing the sheet from the substrate and firing it at 300°–500° C. to remove organic materials and thereafter raising the temperature to 800°–950° C. to produce a dense ceramic sheet.

A preferred aspect of the invention is directed to a method of forming multilayer interconnections, i.e., structures, comprising the steps of:

(f) forming a array of vias according to a predetermined pattern in at least two dielectric ceramic sheets of the type made in the form of tape, by the process described in (a) through (d) above;

(g) filling vias in the sheets with a thick film conductor composition;

(h) printing at least one thick film functional layer according to a predetermined pattern over a surface of each the via-filled sheets of step (g);

(i) laminating the sheets to form an assemblage comprising unfired interconnected functional layers separated by unfired sheets; and (j) cofiring the assemblage.

DETAILED DESCRIPTION OF THE INVENTION

Glass Component

The composition of the glass useful in the method of this invention is not critical in itself. A principal requirement is that the glass should sinter to a hermetic body when it is interdispersed with hollow ceramic microspheres. The glass should also have a low dielectric constant, less than 8 at 1 MHz, and a coefficient of thermal expansion (TCE) in the range of 1-8.5 ppm/°C. compatible with that of silicon (3.5 ppm/°C.). The glass is used in the form of a fine powder, the average particle size being in the range of 0.3-50 μm, preferably 1-20 μm and most preferred in the range of 1-5 μm. It has also been established that the smaller the initial particle size of the glass the greater the loading of hollow microspheres that can attained, while still maintaining the desired hermeticity of the ceramic product. Since there is an inverse relationship between the total volume of hollow microspheres and the dielectric constant of the ceramic product, up to a volume loading range of at least 30%, it is advantageous to achieve the maximum loading of hollow microspheres compatible with desirable firing characteristics.

In addition, glass for use in the method of this invention should have the following additional properties for desirable firing characteristics:

| | |
|---|---|
| Deformation Temperature (Td) | 580-625° C. |
| Softening Temperature (Ts) | 630-700° C. |
| Ts - Td | 50-75° C. |

It has been found that glasses having the above combination of physical properties when fired at 800°-950° C. have an appropriate viscosity at the firing temperature so that the formulation sinters to a very high density, i.e. above 93%, and preferably above 95% theoretical density, thus giving a desirable hermetic layer which inhibits electrical shorting of the conductive electrode layer materials with which the composition is usually fired.

It is, however, essential that the difference between the deformation temperature and softening point of the glass be within the range of 50°-75° C. If this difference is above 75° C., there is too little flow of the glass at 825°-925° C., and if the difference is less than 50° C., there is so much glass flow that migration into the electrode material becomes a problem. (Deformation temperature and softening point are measured with a dilatometer.) Correlation of these two variables defines the viscosity-temperature characteristic of the glass which may be used in the method of the invention.

Further, it is essential that the glass used in the method of this invention have no significant solubilizing effect on the hollow microsphere component of the composition. This is necessary in order to have precise control over the viscosity-temperature characteristics of the glass and thus the rheology of the entire composition during firing. In particular, it is preferred that the hollow microspheres be no more than about 5% wt. soluble in the glass, and, preferably, no more than 3% wt. soluble when fired between 825°-925° C. for periods of up to 30 minutes.

Likewise, the amount of glass relative to the amount of hollow microsphere component is quite important in that if the glass concentration exceeds 95% by volume, basis glass and hollow microspheres, the resultant fired layer tends to have an irregular surface, the multilayer structure tends to become too brittle, solderability of the surface is degraded, and the properties of the associated conductive layers also tend to degrade. On the other hand, if the amount of glass is less than 50% by volume, the fired structure is not sufficiently densified and is too porous. In addition, the fired structure may lose planarity (flatness). In consideration of these variables, it is preferred that the composition contain 50-95% by volume glass and, more preferably, 70-90% by volume glass. Within these limits for the concentration of glass and the complemental amount of hollow microspheres in the composition and the solubility of the hollow microspheres in the glass, it will be apparent that, during firing, the liquid glass will become saturated with the hollow microspheres material.

Examples of the preferred glass powders which are useful in the practice of this invention are magnesium aluminum silicate (cordierite) glass powder, such as SP980 from Specialty Glass Co., and PC-4C-49-P from Pemco Corp. The former has an average particle size of 2.9 μm and loadings up to 35 vol. % hollow sphere gave hermetic ceramic products; the latter has an average particle size of 18 μm and the ceramic product becomes nonhermetic at about a 25 vol. % hollow sphere loading. The degree of hermeticity of a ceramic product is determined by insulation resistance, helium gas permeability, dye penetration, and scanning electron microscopy (SEM). Another preferred glass powder is a borosilicate glass CG 7070 from Corning Glass Company which has a dielectric constant of 4 at 1 MHz.

The hollow microspheres used in this invention consist of thin walled ceramic shells encapsulating air in a spherical cavity. They are in the form of free flowing powders with particle sizes in the range of about 10-200 μm. The ceramic shell thickness is in the range of 1-2 μm.

The microspheres are preferably insoluble or have only a minimal solubility in the glass component and should have a temperature coefficient of expansion (TCE) compatible with the glass component, i.e. in the range of 1-8.5 ppm/°C., to maintain the structural integrity of the finished ceramic product. The presence of the microsphere component can lead to degradation of the flexural strength of the glass matrix. At 20-35% loading of microspheres, the flexural strength of the ceramic product is not more than 10% less than that of the glass matrix. Another function of the microsphere component is the rheological control of the entire system during firing. The hollow microspheres should remain rigid during the firing process, and the softening temperature should be in excess of 900° C., preferable 950° C. The microspherical particles limit the flow of glass by acting as a physical barrier, and they also inhibit sintering of the glass phase and thus facilitate better burn out of organic impurities.

The microsphere content of the ceramic product is a critical aspect of the invention. If too high a loading is used, the product will not be hermetic, and, if too low a loading is used, only a small decrease in dielectric constant can be obtained. The preferred range of hollow microsphere loading is 10-40 vol. %. Above 40% hermeticity tends to decline and surface roughness can also become a problem. However, if glasses with excellent microsphere wetting and sintering characteristics are available, it is possible that up to 50 vol. % loading of microspheres could be used to produce hermetic ceramic products with very low dielectric constants, i.e. in the range of 4 or less at 1 MHz.

The smaller the particle size of the microspheres, the higher the loading that can be used without degrading surface smoothness. For example, surface roughness at high volume loadings of microspheres can be alleviated by sieving the microspheres and using only the finest fraction which passes through a U.S. Sieve Series Number 325; that is, all particles are smaller than 44 μm.

In order to obtain the optimum dielectric constant and best hermeticity for any given composition, it is particularly important that the hollow microspheres in the dielectric ceramic composition are substantially present as uniformly distributed, intact, spherical particles. Thus, the method of preparation must not cause extensive breaking or crushing of the microsphere shells. This is best determined by examining cross sections by SEM.

The purpose of the hollow microspheres is to provide a low dielectric constant ceramic composition. Using the process of this invention, compositions having a dielectric constant in the range of 3 to 5.5 and as low as 3 to 4.5 at 1 MHz can be made.

An example of a hollow microsphere useful in the practice of this invention is Ecospheres ® SI supplied by Emerson and Cumming. These microspheres are thin walled bubbles made from silica, which are in the form of a fine free flowing powder. Particle size is in the range of 30–180 μm; and wall thickness is about 1.5 μm. The material is stable at temperatures to 925° C., and it has a dielectric constant of 1.2 at 1 MHz. The properties of Ecospheres ® SI can be seen in Table 1.

TABLE 1

| Physical Form | Free Flowing Powder |
|---|---|
| True Particle Density (Liquid Displacement) g/cc (lb/ft$^3$) | 0.254 (15.8) |
| Bulk Density (Tamped) g/cc (lb/ft$^3$) | 0.152 (9.5) |
| Packing Factor | 0.559 |
| Particle Size Range, Microns (% by weight) | 175 (0) 100–125 (12) 149–175 (14) 62–100 (40) 125–149 (10) 44–62 (15) 44 (9) |
| Average Particle Diameter, Microns (weight basis) | 80 |
| Average Wall Thickness, Microns (weight basis) | 1.5 |
| Thermal Conductivity of Loosely Packed Material (BTU)(in)/(hr)(ft$^2$)(°F.)-(cal)(cm)/(sec)(cm$^2$)(°C.) | at 0° F. .36 (0.00012) at 300° F. .50 (0.00017) |
| Softening Temperature, °F. (°C.) | 1800 (980) |
| Dielectric Constant (dry) 1 MHz to 8.6 GHz | 1.2 |
| Dissipation Factor (dry) 1 MHz to 8.6 GHz | 0.0005 |

Another example of suitable microspheres is Q-Cel 120 available from PQ Corporation. Q-Cel 120 are strong hollow microspheres with spherical ceramic shells consisting of a proprietary aluminum silicate. They contain a small amount (less than 5%) of crystalline silica, and are stronger and more abrasion resistant than siliceous hollow microspheres and, consequently, are more resistant to disruption when incorporated in a matrix of another material. The properties of Q-Cel 120 hollow microspheres may be been in Table 2.

TABLE 2

| Physical Form | Free-flowing powder |
|---|---|
| Color | Off-white |
| Bulk Density (g/cc)/(lb/ft$^3$) | (0.27–0.44) (17–27) |
| True Density (g/cc)(lb/ft$^3$) | (0.5–0.7) (31–44) |
| Particle Size Range | 5–150 μm |
| Melting Temperature | 1200° C. |

Refractory Component

A particulate refractory component may be added to the compositon for the purpose of adjusting the thermal coefficient of expansion (TCE). The refractory component is chosen on the basis of its TCE, and it must have only a minimal, preferably no, solubility in whatever glass is used therewith. The dielectric constant of the refractory component should be less than 10 at 1 MHz.

Thus, α-quartz, $Al_2O_3$, $CaZrO_3$ or forsterite can be used when relatively high TCE is desired. On the other hand, if a relatively low TCE is desired, the refractory can be selected from mullite, and zirconia, Mixtures of any of these are suitable for the purpose of adjusting the TCE to various intermediate values.

Another function of the refractory is rheological control of the entire system during firing. The refractory particles limit flow of the glass by acting as a physical barrier. They also inhibit sintering of the glass and thus facilitate better burnout of the organics.

For the purpose of obtaining higher densification of the composition upon firing, it is important that the inorganic solids have quite small particle sizes. In particular, the particles should not exceed 15 μm in size and, preferably, they should not exceed 10 μm. Subject to these size limitations, it is preferred that the 50% point of the particles, both glass and refractory, be no less than 1 μm and preferably the 50% point should lie in the 2–5 μm range. The composition may contain 0–20% by volume of the refractory component and preferably 0–10% by volume.

Polymeric Binder

The organic medium in which the glass and microspherical particles are dispersed is comprised of a polymeric binder which is dissolved in a volatile organic solvent which may optionally include other dissolved materials, such as, for example, plasticizers, release agents, dispersing agents, stripping agents, antifouling agents and wetting agents.

To obtain good binding efficiency, it is preferred to use at least 5% wt. polymer binder in the slip composition, and preferably no more than 20% wt. polymer binder in the slip composition. Within these limits, it is desirable to use the least possible amount of binder vis-a-vis solids in order to reduce the amount of organic impurities which must be removed by pyrolysis and to obtain better particle packing which gives reduced shrinkage upon firing.

Various polymeric materials have been employed as the binder for green tapes, e.g. poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrrolidone), polyamides, high molecular weight polyethers, copolymers of ethylene oxide and propylene oxide, polyacrylamides, and various acrylic polymers such as sodium polyacrylate, poly(lower alkyl) acrylate, poly(lower alkyl) methacrylates and various copolymers and multipolymers of lower alkyl acrylates and methacrylates. Copolymers of ethyl methacrylate and methyl acrylate and terpolymers of ethyl acrylate, methyl methacrylate and methacrylic acid have also been used as binders for slip casting materials.

U.S. Pat. No. 4,536,535 to Usala, the teachings of which are incorporated herein by reference, discloses an organic binder comprising a mixture of compatible multipolymers of 1-100% wt. $C_{1-8}$ alkyl methacrylate, 100-0% wt. $C_{1-8}$ alkyl acrylate and 0-5% wt. ethylenically unsaturated carboxylic acid or amine. Because these polymers permit the use of minimum amounts of binder and maximum amounts of dielectric solids, they are preferred for preparing dielectric compositions according to the method of this invention.

Frequently, the polymeric binder will also contain a plasticizer which serves to lower the glass transition temperature (Tg) of the binder polymer. The amount of plasticizer used is usually in the range of 10-50% by weight of the binder polymer in the slip composition. The choice of plasticizer is, of course, determined primarily by the polymer which must be modified. Among the plasticizers which have been used successfully in binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it is effective in relatively small concentrations.

Organic Solvent

The solvent component of the casting solution is chosen so as to obtain complete solution of the polymer and with sufficiently high volatility to evaporate from the dispersion by the application of relatively low levels of heat at atmospheric pressure. This will usually amount to between 20-50% by weight of the slip composition. In addition, the solvent must boil well below the boiling point and decomposition temperature of any other additives contained in the organic medium. Thus, solvents having atmospheric boiling points below 150° C. are preferred. Such solvents include acetone, xylene, methanol, ethanol, isopropanol, methyl ethyl ketone, 1,1,1-trichloroethane, tetrachloroethylene, amyl acetate, 2,2,4-triethylpentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

A particularly preferred solvent is comprised of 1,1,1-trichloroethane containing no more than 10% by wt. each of isopropanol, methyl ethyl ketone, methylene chloride and fluorocarbons such as trichlorofluoromethane and trichlorotrifluoroethane.

It is preferred that the above-described solvent blend contains 3-7% by wt. methylene chloride which has been found to prevent cracking and crazing of the polymeric binder during tape preparation. It is also preferred that the solvent contain 3-6% wt. isopropanol which has been found to reduce the viscosity of the casting slurry. Similarly, it is desirable to have 4-8% by wt. methyl ethyl ketone in the blend because of its polymer solvency and somewhat lower volatility. In addition, for safety reasons the solvent should contain 6.5-9.3% wt. volatile fluorocarbons to raise the flash point of the blend. Though at least 6.5% wt. fluorocarbon is needed to obtain suitable shifting of the flash point (ASTM Tag Closed Cup), no more than 9.0% wt. should be used lest it affect the polymer solvency of the solvent blend. A particularly preferred solvent blend contains the following range of components:

| | |
|---|---|
| 1,1,1-trichloroethane | 83.5-70 |
| Methylene Chloride | 7-3 |
| Methyl Ethyl Ketone | 9-4 |
| Isopropanol | 6-3 |
| Fluorocarbon | 9.3-6.5 |

The proportions are all given as percent by weight.

Preparation of Green Ceramic Composition

The polymeric binder, organic solvent and plasticizer are weighed into a container provided with a stirrer and blended together with the desired amount of glass powder and optional refractory powder. The blended components are then transferred to a ceramic mill. The grinding media is not critical, and any of the conventional ceramic grinding materials may be used provided that do not cause any significant contamination of the dispersion. A preferred milling material is ¼" zirconia cylinders. The components can be milled by rolling or shaking the mill on a vibrator for 1-2 hours to homogeneously disperse them, and the resulting slip can be recovered by separating the milling medium on a screen. The desired amount of hollow microsphere powder is added to the slip in a high speed mixer and the mixture is blended rapidly for several minutes to give a uniform slip, having a viscosity in the range of 500-1500 cps. It is important to avoid any crushing or grinding action when the hollow microspheres are incorporated in the slip so that the microspheres remain intact. The slip is then deaerated by rolling in a container for 15-30 minutes.

The slip is then fed to a casting machine to make a tape on a suitable substrate, such as a metal belt or a plastic film which can be of Mylar ®, polyethylene, polypropylene or the like. Many factors influence the thickness of the wet cast film at a given gate opening, such as, for example, the hydrodynamic head of the slip reservoir behind the wet film blade, the viscosity of the slip, and the speed with which the film is cast. All these are susceptible to variation, but tapes of the required thickness and dimensions can be readily produced by one skilled in the art. A representative wet film thickness, measured using a hand micrometer or an electrical capacitance gauge, is about 15 mils. Thickness uniformity is important, and a tape should not vary by more than ±2% in thickness.

Immediately after casting, the solvent is vaporized from the wet film by exposing it to a stream of air heated to 20°-50° C. Heat increases the drying rate, but caution must be exercised if a crack- and bubble-free drying of the slip is to be achieved. It is preferred that the slip be fed to the casting machine immediately on preparation, and, in any event, it should be cast into a film and dried within one hour of final mixing for best results. If there is too long a delay between the preparation of slip and the green tape, the constituents of the slip will begin to separate, and the resulting green tape will not be homogeneous. Acceptable green tapes should have a density at least 70% of theoretical, i.e., not more than 30% open porosity. Also, the elastic modulus should be in excess of 10,000 p.s.i.

Sintering of Green Ceramic

During the sintering cycle, first the binders are broken down and volatilized. This is accomplished by firing at temperatures in the range of 300°–500° C., the atmosphere in the furnace being carefully controlled to have enough oxygen to burn the binders out cleanly and prevent loss of silica from the ceramic. After the organic components have been volatilized, the temperature is increased to the 800°–950° C. range and held for a soak period of at least 30 minutes to achieve optimum densification. Cooling is done slowly to avoid shock cracks. A typical ceramic tape thickness is about 5 mils ±2%, and the density should be greater than about 93% of theoretical, preferably greater than 95% of theoretical. On completion of the firing step, the glass matrix may be either crystalline or non-crystalline depending on the type of glass powder unsed in the process. Insulation resistance should exceed $10^6$ megohms, and the dissipation factor should be less than 0.2%.

Application

The green tape is used primarily as a dielectric or insulating material for multilayer electronic circuits. A roll of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize the green tape. Typical via hole sizes range from 0.006" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit elements. In addition, specially formulated high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing is carried out in a standard thick film conveyor belt furnace.

As used herein, the term "firing" means heating the assemblage in an oxidizing atmosphere such as air to a temperature and for a time sufficient to volatilize (burn out) all of the organic material in the layers of the assemblage, to sinter any glass, metal or dielectric material in the layers and thus densify the dielectric layer.

It will be recognized by those skilled in the art that in each of the laminating steps the layers must be accurate in registration so that the vias are properly connected to the appropriate contact points of the adjacent functional layer.

The term "functional layers" refers to the layers printed on the ceraic green tape which have either conductive, resistive or capacitive functionality. Thus, as indicated above, a typical green tape layer may have printed thereon one or more resistor circuits and/or capacitors as well as a conductive circuit. The present invention is further illustrated in the following Examples.

EXAMPLE 1

Into a 250 ml beaker were charged 58.2 parts by weight (pbw) 1,1,1-trichloroethane, 5.00 pbw Du Pont acrylate binder 5200 (30% polymer binder in methyl ethyl ketone solution) and 5.32 pbw Santicizer ®160 (butyl benzyl phthalate). While stirring with a 1¾" cowles blade, 99.9 pbw of Specialty Glass Co., cordierite glass powder SP 980, previously dried for 72 hours in a vacuum oven at 110° C., were added. After stirring for 3 minutes the uniform dispersion was poured into an 8 ounce procelain mill containing 450 pbw ¼" zirconia radius ended cylinders. The mill was shaken on a Red Devil paint shaker for 90 minutes. 28.7 pbw Du Pont acrylate binder 5200 were added and the mill was shaken for 5 more minutes.

The contents of the mill were poured onto a coarse mesh screen placed on top of a glass jar. The zirconia cylinders were retained on the screen and the slip drained into the jar. The viscosity of the slip (measured with a Haake RV3 Rotovisco using a concentric cylinder sensor system) was measured as 751 cps. The ceramic to binder ratio was 9.8.

100 pbw of the above slip was added to a Cowles mixer with about a 1" blade in a 4 ounce jar. With mild agitation 6.06 pbw of PQ Corp. Q-Cel 120 hollow microspheres, previously screened through a U.S. Sieve Series No. 325, were added. This was equivalent to a 30% volume loading in the final ceramic tape. The composition was stirred at 1000 rpm for 3 minutes. The container was placed on rollers and rotated at 20 rpm for ½ hour to deaerate the slip, which was then used immediately to cast a green tape on a polypropylene film using a casting machine with a 15 mil doctor blade setting, to give a wet cast film 15 mil thick, 2¼" wide and 8 feet long.

The cast tape was then air dried at 30° C. for about 5 minutes, and then removed from the polypropylene backing and die cut into 1½" squares. Four squares were laminated together at 70° C. using a hydraulic press at 3000 psi for 10 minutes. The laminated tape was placed on a 4"×4" alumina setter in an air furnace, and the temperature was raised at 10° C. per minute and held at 450° C. for 1 hour to burn out organic components. The temperature was then raised at 10° C. per minute and held at 925° C. for 1 hour, after which the sintered tape was cooled to room temperature at a cooling rate of 10° C. per minute. The dielectric constant of the tape measured at 1 MHz was 4.77. The density was 1.95, which is 96% of theoretical, and the dissipation factor was <0.4%.

A sample of the slip to which no hollow microspheres were added was cast into a tape and subjected to the same drying and firing cycle. The dielectric constant of the tape was measured at 1 MHz and found to be 5.85. The density was 2.55, which is 97% of theoretical, and the dissipation factor was <0.4%.

EXAMPLE 2

Using the same procedures as Example 1, a glass slip, having a ceraic to binder ratio of 8.3, was made from the components given below:

|   | pbw |
|---|---|
| Cordierite glass powder SP980 | 120.5 |
| 1,1,1-Trichloroethane | 80 |
| Du Pont 5200 acrylate binder | 48.5 |
| Santicizer ® 160 | 9 |
|   | 258 |

To 150 pbw of this slip, 3.0 pbw of Ecospheres ® SI hollow microspheres, previously screened through a U.S. Sieve Series No. 325, were added, and a casting slip was prepared as in Example 1. This was equivalent to a 30% volume loading in the final ceramic tape. A green tape was made and used to prepare a four layer fired laminate as described in Example 1.

The tape had a dielectric constant of 4.47 at 1 MHz, a density of 1.83 (95% of theoretical) and a dissipation factor of <0.4%.

EXAMPLE 3

A green tape was prepared following the procedure of Example 2 except for a reduction from 3.0 to 1.76 pbw in the amount of Ecospheres ® SI added to the glass slip. This was equivalent to a 20% volume loading in the final ceramic tape. The tape has a dielectric constant of 5.11 at 1 MHz a density of 2.13 (98% of theoretical), and a dissipation factor of <0.4%.

EXAMPLE 4

Using the same procedure as Example 1, a glass slip having a ceramic to binder ratio of 8.6 was made from the components given below:

|   | pbw |
|---|---|
| Cordierite glass powder SP980 | 110 |
| Alumina (Alcoa A16) | 23.2 |
| 1,1,1-Trichloroethane | 95 |
| Du Pont 5200 Acrylate binder | 51.5 |
| Santicizer ® 160 | 10.3 |
|   | 290 |

To 215 pbw of this slip 2.35 pbw of Ecospheres ® SI hollow microspheres, previously screened through a U.S. Sieve Series 325, were added and a casting slip prepared as in Example 1. This was equivalent to a 20% volume loading of microspheres and a 10% volume loading of alumina in the final ceramic tape. A green tape was made and used to prepare an eight layer laminate by the procedures of Example 1.

The tape had a dielectric constant of 5.25 at 1 MHz, a density of 2.43 (95% of theoretical), and a dissipation factor of <0.4%.

EXAMPLE 5

Using the same procedure as Example 1, a glass slip having a ceramic to binder ratio of 12.8 was made from the components given below:

|   | pbw |
|---|---|
| Cordierite glass powder SP980 | 99 |
| Zirconia 5-10 μm particle size | 17.6 |
| 1,1,1-Trichloroethane | 70 |
| Du Pont 5200 acrylate binder | 35 |
| Santicizer ® 160 | 8.4 |
|   | 230 |

To 175 pbw of this slip, 12.3 pbw of PQ Corporation, Q-Cel 120 hollow microspheres, previously screened through a U.S. Sieve Series 325, were added and a casting slip prepared as in Example 1. This was equivalent to a 35% volume loading of mirospheres and a 5% volume loading of zirconia in the final ceramic tape. A green tape was made and used to prepare a four layer laminate as described in Example 1.

The tape had a dielectric constant of 4.25 at 1 MHz, a density of 1.98 (93% of theoretical), and a dissipation factor of <0.4%.

EXAMPLE 6

Using the same procedures as in Example 1, a glass slip having a ceramic to binder ratio of 8.5 was made from the components given below:

|   | pbw |
|---|---|
| Cordierite glass powder Pemco PC-4C-49-P | 120 |
| 1,1,1-Trichloroethane | 76 |
| Du Pont 5200 acrylate binder | 47 |
| Santicizer ® 160 | 7 |
|   | 250 |

To 100 pbw of this slip, 2.45 pbw of PQ Corporation Q-Cel 120 hollow microspheres, previously screened through a 325 Series U.S. Sieve, were added and a casting slip prepared as in Example 1. This was equivalent to a 15% volume loading of microspheres. A green tape was made and used to prepare a four layer laminate as described in Example 1.

The tape had a dielectric constant of 5.27 at 1 MHz, a density of 2.27 (96% of theoretical, and a dissipation factor <0.4%.

A sample of the glass slip to which no hollow microspheres were added was cast into a tape and subjected to the same drying and firing cycle.

The tape had a dielectric constant of 5.91 at 1 MHz, a density of 2.59 (98% of theoretical), and a dissipation factor of <0.4%.

EXAMPLE 7

To 100 pbw of a glass slip prepared as described in Example 6, 4.48 pbw of PQ Corporation Q-Cel 120 hollow microspheres, previously screened through a 325 Series U.S. Sieve, were added and a casting slip prepared as in Example 1. This was equivalent to a 25% volume loading of microspheres. A green tape was made and used to prepare an eight layer laminate by the procedures of Example 1. The tape had a dielectric constant of 4.33 at 1 MHz, a density of 2.02 (93% of theoretical), and a dissipation factor of <0.4%.

EXAMPLE 8

Using the same procedure as Example 1, a glass slip having a ceramic to binder ratio of 10.0 was made from the components given below:

|   | pbw |
|---|---|
| Cordierite glass powder Pemco PC-4C-49-P | 115 |
| Zirconia 10-15 μm particle size | 34.8 |
| 1,1,1-Trichloroethane | 100 |
| Du Pont 5200 acrylate binder | 50 |
| Santicizer ® 160 | 10.2 |

| | pbw |
|---|---|
| | 310 |

To 120 pbw of this slip, 3.56 pbw of PQ Corporation Q-Cel 120 hollow microspheres, previously screened through a U.S. Sieve Series 325, were added and a casting slip prepared as in Example 1. This was equivalent to a 20% volume loading of microspheres and a 10% volume loading of zirconia in the final ceramic tape. A green tape was made and used to prepare a four layer laminate as described in Example 1. The tape had a dielectric constant of 4.65 at 1 MHz, a density of 2.38 (93% of theoretical), and a dissipation factor of <0.4%.

EXAMPLE 9

Using the same procedures as in Example 1, a glass slip having a ceramic to binder ratio of 5.56 was made from the components given below:

| | pbw |
|---|---|
| Borosilicate glass CG 7070 | 100 |
| 1,1,1-Trichloroethane | 101 |
| Du Pont 5200 acrylate binder | 60 |
| Santicizer ® 160 | 9 |
| | 270 |

To 150 pbw of the slip 13.05 pbw of PQ Corporation Q-Cel 120 hollow microspheres, previously screened through a U.S. Sieve Series 325, were added and a casting slip prepared as in Example 1. This was equivalent to a 40% volume loading of microspheres. A green tape was made and used to prepare a four layer laminate as described in Example 1, but a final sintering temperature of 850° C. was used for 1 hour.

The tape had a dielectric constant of 3.25 at 1 MHz, a density of 1.49 (93% of theoretical), and a dissipation factor of <0.4%.

A sample of the glass slip to which no hollow microspheres were added was cast into a tape and subjected to the same drying and firing cycle.

The tape had a dielectric constant of 4.20 at 1 MHz, a density of 2.11 (97% of theoretical), and dissipation factor of <0.4%.

EXAMPLE 10

Using the same procedures as in Example 1, a glass slip having a ceramic binder ratio of 7.73 was made from the components given below:

| | pbw |
|---|---|
| Borosilicate glass CG 7070 | 100 |
| Alumina 5-10 μm particle size | 27.5 |
| 1,1,1-Trichloroethane | 80 |
| Du Pont 5200 acrylate binder | 55 |
| Santicizer ® 160 | 7.5 |
| | 270 |

To 150 pbw of this slip 10.16 pbw of PQ Corporation Q-Cel 120 hollow microspheres, previously screened through a U.S. Sieve Series 325, were added and a casting slip prepared as in Example 1. This was equivalent to a 35% volume loading of microspheres and a 10% volume loading of alumina in the final ceramic tape. A green tape was made and used to prepare an eight layer laminate by the procedure of Example 1, using a final sintering temperature of 850° C. for 1 hour.

The tape had a dielectric constant of 3.55 at 1 MHz, a density of 1.76 (95% of theoretical), and a dissipation factor of <0.4%.

What is claimed is:

1. A method for making a dielectric sheet composition having a low dielectric constant and a high hermeticity comprising the steps of:
   (a) mixing a glass powder having an average particle size in the range of 0.3 to 50 μm with a volatile, organic solvent containing an organic polymer binder and an organic plasticizer to form a uniform dispersion;
   (b) milling the dispersion to pulverize and uniformly disperse the glass component;
   (c) dispersing ceramic hollow microspheres having a particle size in the range of 10–200 μm at high speed into the milled dispersion to form a slip having a viscosity in the range of 500–1500 cps;
   (d) deareating the slip and casting a thin layer thereof onto a flexible substrate forming a sheet within one hour of final mixing and heating the cast layer until solvent has been removed; and
   (e) removing the sheet fromm the substrate and firing it to remove organic material and then sintering the sheet.

2. A method for making a dielectric sheet composition having a dielectric constant in the range of 3 to 5.5 at 1 MHz and a density greater than 93% of theoretical comprising the steps of:
   (a) mixing a glass powder having an average particle size in the range of 1 to 50 μm, in an amount sufficient to constitute 50 to 95 vol. % of the dielectric composition, with a volatile, non-aqueous organic solvent polymeric binder comprising 5 to 20% by weight of the mixture and 10 to 50% by weight based on the polymeric binder of an organic plasticizer;
   (b) milling the mixture for 1 to 2 hours to pulverize and uniformly disperse the glass component;
   (c) adding ceramic hollow microspheres having a particle size in the range of 10 to 200 μm, in an amount sufficient to constitute 10 to 50 vol. % of the dielectric composition, and dispersing them at high speed to form a slip having a viscosity in the range of 500 to 1500 cps;
   (d) deareating the slip and within one hour of final mixing casting a thin layer thereof having a thickness variation of not more than ±2% onto a flexible substrate to form a sheet, and heating the cast sheet at 20° to 50° C. to remove the solvent;
   (e) removing the sheet from the substrate and heating it in an oxidizing atmosphere at 300° to 500° C. to remove organic material and thereafter sintering the sheet by raising its temperature to 800° to 950° C. for at least 30 minutes.

3. The method of claim 2 wherein a refractory compound comprised of particles not exceeding 15 μm is added to the glass powder in step (a) in an amount sufficient to constitute up to 20 vol. % of the dielectric composition.

4. The method of claim 1, 2 or 3 wherein the glass powder is a magnesium aluminum silicate glass powder or a borosilicate glass powder.

5. The method of claim 4 wherein the glass powder has an average particle size in the range of 1 to 20 μm and constitutes 70 to 90 vol. % of the dielectric composition.

6. The method of claim 5 wherein the ceramic hollow microspheres are smaller than 44 μm and constitute 10 to 40 vol. % of the dielectric composition.

7. The method of claim 3 wherein the refractory compound is selected from the group consisting of α-quartz, alumina, zirconia, calcium zirconate, forsterite and mullite.

8. The method of claim 1, 2 or 3 wherein the organic solvent is 1,1,1-trichloroethane which contains no more than 10% by weight each of isopropanol, methyl ethyl ketone, methyl chloride and volatile fluorocarbons.

9. The method of claim 8 wherein the organic solvent contains 3 to 6% by weight isopropanol, 4 to 8% by weight methyl ethyl ketone, 3 to 7% by weight methylene chloride and 6.5 to 9.3% by weight of volatile fluorocarbons.

10. A method of forming a multilayer structure comprising the steps of:
(a) forming an array of vias according to a predetermined pattern in at least two dielectric ceramic sheets of the type defined by claim 1 or 2;
(b) filling the vias in the sheets with a thick film conductor composition;
(c) printing at least one thick film functional layer according to a predetermined pattern over a surface of each sheet;
(d) laminating the sheets to form an assemblage of unfired interconnected functional layers separated by unfired sheets; and
(e) cofiring the assemblage.

* * * * *